United States Patent
Kao et al.

(10) Patent No.: US 12,518,960 B2
(45) Date of Patent: Jan. 6, 2026

(54) COMPOSITION COMPRISING A SILOXANE AND AN ALKANE FOR AVOIDING PATTERN COLLAPSE WHEN TREATING PATTERNED MATERIALS WITH LINE-SPACE DIMENSIONS OF 50 NM OR BELOW

(71) Applicant: BASF SE, Ludwigshafen am Rhein (DE)

(72) Inventors: Chi Yueh Kao, Taoyuan (TW); Mei Chin Shen, Taoyuan (TW); Andreas Klipp, Ludwigshafen (DE); Haci Osman Guevenc, Ludwigshafen (DE); Daniel Loeffler, Ludwigshafen (DE)

(73) Assignee: BASF SE, Ludwigshafen am Rhein (DE)

( * ) Notice: Subject to any disclaimer, the term of this patent is extended or adjusted under 35 U.S.C. 154(b) by 429 days.

(21) Appl. No.: 18/004,348

(22) PCT Filed: Jun. 29, 2021

(86) PCT No.: PCT/EP2021/067916
§ 371 (c)(1),
(2) Date: Jan. 5, 2023

(87) PCT Pub. No.: WO2022/008306
PCT Pub. Date: Jan. 13, 2022

(65) Prior Publication Data
US 2023/0274930 A1    Aug. 31, 2023

(30) Foreign Application Priority Data
Jul. 9, 2020  (EP) .................................... 20185047

(51) Int. Cl.
| | | |
|---|---|---|
| *H01L 21/02* | (2006.01) | |
| *C11D 3/37* | (2006.01) | |
| *C11D 7/50* | (2006.01) | |
| *G03F 7/40* | (2006.01) | |

(52) U.S. Cl.
CPC ........ *H01L 21/0206* (2013.01); *C11D 3/3734* (2013.01); *C11D 3/3738* (2013.01); *C11D 7/5022* (2013.01); *C11D 7/5027* (2013.01); *G03F 7/40* (2013.01); *C11D 2111/22* (2024.01)

(58) Field of Classification Search
CPC . H01L 21/0206; C11D 3/3734; C11D 3/3738; C11D 7/5022
See application file for complete search history.

(56) References Cited

U.S. PATENT DOCUMENTS

| | | | | |
|---|---|---|---|---|
| 10,224,485 | B2 * | 3/2019 | Weitz ................... | H10K 85/621 |
| 10,954,400 | B2 * | 3/2021 | Romanato ........... | C08G 18/227 |
| 11,174,394 | B2 * | 11/2021 | Wojtczak ............... | C09D 7/63 |
| 11,180,719 | B2 * | 11/2021 | Loeffler ............... | C11D 3/3734 |
| 11,264,250 | B2 * | 3/2022 | Reichardt ........... | H01L 21/3212 |
| 11,292,784 | B2 * | 4/2022 | Viertelhaus .......... | C07D 403/14 |
| 11,788,024 | B2 * | 10/2023 | Harhausen ............. | C10L 10/04 |
| | | | | 44/302 |
| 11,891,592 | B2 * | 2/2024 | Polignone .......... | C11D 17/0043 |
| 12,269,247 | B2 * | 4/2025 | Licht ..................... | B32B 5/026 |

(Continued)

FOREIGN PATENT DOCUMENTS

| | | | | |
|---|---|---|---|---|
| CN | 104471487 A | * | 3/2015 | ........... G03F 7/2041 |
| CN | 104428716 B | * | 6/2019 | ......... H01L 21/0274 |

(Continued)

OTHER PUBLICATIONS

International Search Report and Written Opinion for corresponding PCT/EP2021/067916 mailed Aug. 17, 2021; 10 pages.

(Continued)

*Primary Examiner* — Laura M Menz
(74) *Attorney, Agent, or Firm* — Armstrong Teasdale LLP

(57) ABSTRACT

Described herein is a non-aqueous composition including
(a) an organic solvent;
and
(b) at least one additive of formulae I or II

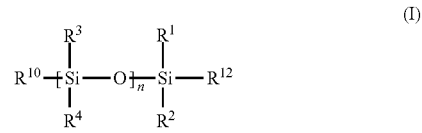

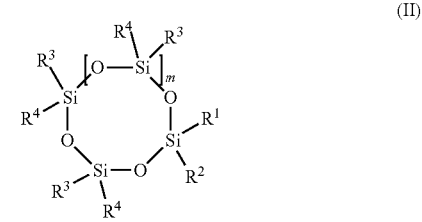

where
$R^1$ is H
$R^2$ is selected from the group consisting of H, $C_1$ to $C_{10}$ alkyl, $C_1$ to $C_{10}$ alkoxy, $C_6$ to $C_{10}$ aryl, and $C_6$ to $C_{10}$ aroxy,
$R^3$ is selected from the group consisting of $R^2$,
$R^4$ is selected from the group consisting of $C_1$ to $C_{10}$ alkyl, $C_1$ to $C_{10}$ alkoxy, $C_6$ to $C_{10}$ aryl, and $C_6$ to $C_{10}$ aroxy,
$R^{10}$, $R^{12}$ are independently selected from the group consisting of $C_1$ to $C_{10}$ alkyl and $C_1$ to $C_{10}$ alkoxy,
m is 1, 2 or 3, and
n is 0 or an integer from 1 to 100.

18 Claims, No Drawings

(56) References Cited

U.S. PATENT DOCUMENTS

| | | | |
|---|---|---|---|
| 2008/0299487 A1 | 12/2008 | Chang | |
| 2013/0034813 A1* | 2/2013 | Ohsawa | G03F 7/0397 |
| | | | 430/326 |
| 2013/0255534 A1* | 10/2013 | Ryokawa | H01L 21/0206 |
| | | | 106/2 |
| 2016/0279677 A1* | 9/2016 | Ball | B08B 9/08 |
| 2018/0254182 A1* | 9/2018 | Shirai | H01L 21/31058 |
| 2019/0211210 A1* | 7/2019 | Wojtczak | C09D 5/00 |
| 2020/0040203 A1* | 2/2020 | Romanato | C08G 18/4018 |
| 2020/0255772 A1* | 8/2020 | Loeffler | C11D 7/5004 |
| 2020/0266489 A1* | 8/2020 | Han | C07C 309/84 |
| 2020/0294813 A1* | 9/2020 | Reichardt | H01L 21/3212 |
| 2020/0354337 A1* | 11/2020 | Viertelhaus | C07D 401/14 |
| 2022/0169956 A1* | 6/2022 | Kao | G03F 7/40 |
| 2022/0187712 A1* | 6/2022 | Csihony | C11D 7/261 |
| 2022/0220401 A1* | 7/2022 | Harhausen | C10L 10/04 |
| 2023/0072815 A1* | 3/2023 | Mertoglu | A01N 57/20 |
| 2023/0096769 A1* | 3/2023 | Mertoglu | A01N 25/30 |
| | | | 504/134 |
| 2023/0211598 A1* | 7/2023 | Licht | B32B 5/026 |
| | | | 156/703 |
| 2023/0274930 A1* | 8/2023 | Kao | C11D 7/5022 |
| | | | 438/758 |
| 2023/0326759 A1* | 10/2023 | Lopez Villanueva | |
| | | | H01L 21/30604 |
| | | | 438/689 |
| 2023/0416628 A1* | 12/2023 | Harhausen | C10L 10/04 |
| 2024/0287696 A1* | 8/2024 | Zhu | C25C 7/06 |
| 2024/0319592 A1* | 9/2024 | Lee | G03F 7/0042 |
| 2025/0040539 A1* | 2/2025 | Rohwer | A01N 31/16 |
| 2025/0115809 A1* | 4/2025 | Lopez Villanueva | C09K 13/08 |

FOREIGN PATENT DOCUMENTS

| | | | | |
|---|---|---|---|---|
| CN | 113574460 A | * | 10/2021 | H01L 21/02057 |
| CN | 115943199 A | * | 4/2023 | H01L 21/02057 |
| EP | 2932525 A1 | | 10/2015 | |
| EP | 3704547 A1 | * | 9/2020 | C11D 3/373 |
| EP | 3953768 A1 | * | 2/2022 | C11D 11/0047 |
| EP | 3956729 A1 | * | 2/2022 | B81C 1/00928 |
| JP | 2022527614 A | * | 6/2022 | G03F 7/405 |
| JP | 2022529066 A | * | 6/2022 | G03F 7/40 |
| KR | 101658493 B1 | * | 9/2016 | C07C 39/06 |
| KR | 102209867 B1 | * | 1/2021 | H01L 21/02057 |
| KR | 20210149065 A | * | 12/2021 | G03F 7/405 |
| KR | 20230015920 A | * | 1/2023 | C11D 11/0047 |
| KR | 20230038181 A | * | 3/2023 | G03F 7/40 |
| TW | 202104572 A | * | 2/2021 | H01L 21/02057 |
| TW | 1834671 B | * | 3/2024 | C11D 7/261 |
| WO | 2012027667 A2 | | 3/2012 | |
| WO | WO-2019086374 A1 | * | 5/2019 | H01L 21/02057 |
| WO | WO-2020207824 A1 | * | 10/2020 | C11D 7/241 |
| WO | WO-2020212173 A1 | * | 10/2020 | H01L 21/02057 |
| WO | WO-2022008306 A1 | * | 1/2022 | G03F 7/40 |

OTHER PUBLICATIONS

European Search Report for EP Patent Application No. 20185047.6, Issued on Nov. 25, 2020, 3 pages.

* cited by examiner

COMPOSITION COMPRISING A SILOXANE AND AN ALKANE FOR AVOIDING PATTERN COLLAPSE WHEN TREATING PATTERNED MATERIALS WITH LINE-SPACE DIMENSIONS OF 50 NM OR BELOW

CROSS-REFERENCE TO RELATED APPLICATIONS

This application is a U.S. National Phase Application of PCT/EP2021/067916, filed Jun. 29, 2021, which claims the benefit of priority to European Patent Application No. 20185047.6, filed Jul. 9, 2020, the entire contents of which are hereby incorporated by reference herein.

The present invention is directed to a composition for anti-pattern-collapse treatment, its use for and a process for manufacturing integrated circuits devices, optical devices, micromachines and mechanical precision devices.

BACKGROUND OF THE INVENTION

In the process of manufacturing ICs with LSI, VLSI and ULSI, patterned material layers like patterned photoresist layers, patterned barrier material layers containing or consisting of titanium nitride, tantalum or tantalum nitride, patterned multi-stack material layers containing or consisting of stacks e.g. of alternating polysilicon and silicon dioxide or silicon nitride layers, and patterned dielectric material layers containing or consisting of silicon dioxide or low-k or ultra-low-k dielectric materials are produced by photolithographic techniques. Nowadays, such patterned material layers comprise structures of dimensions even below 22 nm with high aspect ratios.

Irrespective of the exposure techniques the wet chemical processing of small patterns however involves a plurality of problems. As technologies advance and dimension requirements become stricter and stricter, patterns are required to include relatively thin and tall structures or features of device structures i.e., features having a high aspect ratio, on the substrate. These structures may suffer from bending and/or collapsing, in particular, during the spin dry process, due to excessive capillary forces of the liquid or solution of the rinsing liquid deionized water remaining from the chemical rinse and spin dry processes and being disposed between adjacent patterned structures.

Due to the shrinkage of the dimensions, the removal of particles and plasma etch residues in order to achieve a defect free patterned structure becomes also a critical factor. This does apply to photoresist patterns but also to other patterned material layers, which are generated during the manufacture of optical devices, micromachines and mechanical precision devices.

WO 2012/027667 A2 discloses a method of modifying a surface of a high aspect ratio feature by contacting the surface of the high aspect ratio feature with an additive composition to produce a modified surface, wherein forces acting on the high aspect ratio feature when a rinse solution is in contact with the modified surface are sufficiently minimized to prevent bending or collapse of the high aspect ratio feature at least during removal of the rinse solution or at least during drying of the high aspect ratio feature. The modified surface should have a contact angle in a range from about 70 degrees to about 110 degrees. Besides many other types of acids, bases, non-ionic surfactants, anionic surfactants, cationic surfactants, and zwitterionic surfactants, some siloxane-type surfactants are disclosed. A variety of organic solvents, including ethylene glycol, isopropanol, 1-methoxy-2-propyl acetate, isopropyl acetate, ethyl carbonate, dimethyl sulfoxide, and hydrocarbons like hexane are mentioned.

US 2018/0254182 A discloses the use of silanes like hexamethyl disilazane in compositions for surface treatment that is capable of highly hydrophobizing (silylating) a surface of a treatment target while deterioration of polyvinyl chloride is suppressed when surface treatment of the treatment target such as an inorganic pattern and a resin pattern is carried out using a device having a liquid contact portion provided with a member made of polyvinyl chloride.

WO 2019/086374 discloses a water based anti-pattern collapse solution comprising a siloxane-type additive.

US 2013/255534 A1 discloses anti pattern collapse cleaning compositions comprising silanes and organic solvents.

Non-published European Patent application No. 19168153.5 discloses a composition comprising an ammonia-activated siloxane and a polar protic solvent like isopropanol, optionally in combination with an alkane, for avoiding pattern collapse when treating patterned materials with line-space dimensions of 50 nm or below.

However, these compositions still suffer from high pattern collapse in sub 50 nm structures, particular if an SC1 pretreatment with ammonia and hydrogen peroxide is required.

It is an object of the present invention to provide a composition and method for manufacturing integrated circuits for nodes of 50 nm and lower, in particular for nodes of 32 nm and lower and, especially, for nodes of 22 nm and lower, which method no longer exhibits the disadvantages of prior art manufacturing compositions and methods.

In particular, the compounds according to the present invention shall allow for the chemical rinse of patterned material layers comprising patterns with a high aspect ratio and line-space dimensions of 50 nm and less, in particular, of 32 nm and less, especially, of 22 nm and less, without causing pattern collapse. Furthermore, it is an object of the present invention to provide a composition that provides a reduced pattern collapse on substrates that require an alkaline pretreatment like SC1 treatment, such as but not limited to silicon, silicon oxide, and silicon nitride.

SUMMARY OF THE INVENTION

The present invention completely avoids, all the disadvantages of the prior art by using a non-aqueous composition comprising a non-polar organic solvent in combination with a siloxane-type non-ionic additive as described herein. Surprisingly it was found that only H silanes in combination with linear, branched or cyclic $C_5$ to $C_{12}$ alkane or a benzene substituted by 1 to 3 $C_1$ to $C_4$ alkyl group solve the problems associated with the prior art compositions and particularly lead to a high non-collapse rate.

A first embodiment of the present invention is a non-aqueous composition essentially consisting of
  (a) an organic solvent selected from
    (i) a linear, branched or cyclic $C_5$ to $C_{12}$ alkane, and
    (ii) a benzene substituted by 1 to 3 $C_1$ to $C_4$ alkyl groups; and
  (b) at least one additive of formulae I or II

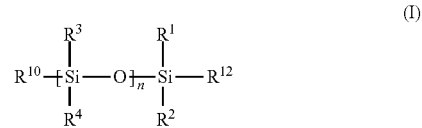

-continued

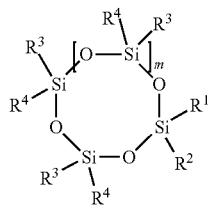

(II)

wherein
R¹ is H
R² is selected from H, $C_1$ to $C_{10}$ alkyl, $C_1$ to $C_{10}$ alkoxy, $C_6$ to $C_{10}$ aryl, and $C_6$ to $C_{10}$ aroxy,
R³ is selected from R²,
R⁴ is selected from $C_1$ to $C_{10}$ alkyl, $C_1$ to $C_{10}$ alkoxy, $C_6$ to $C_{10}$ aryl, and $C_6$ to $C_{10}$ aroxy,
$R^{10}$, $R^{12}$ are independently selected from $C_1$ to $C_{10}$ alkyl and $C_1$ to $C_{10}$ alkoxy,
m is 1, 2 or 3,
n is 0 or an integer from 1 to 100.

The additives according to the invention comprising at least one H atom bound to an Si atom provide better pattern collapse rates when used for cleaning than fully-substituted ones.

Another embodiment of the present invention is the use of the compositions described herein for treating substrates having patterned material layers having line-space dimensions of 50 nm or below, aspect ratios of greater or equal 4, or a combination thereof.

Yet another embodiment of the present invention is a method for manufacturing integrated circuit devices, optical devices, micromachines and mechanical precision devices, the said method comprising the steps of
(a) providing a substrate having patterned material layers having line-space dimensions of 50 nm or below, aspect ratios of greater or equal 4, or a combination thereof,
(b) contacting the substrate with an aqueous pretreatment composition comprising ammonia and hydrogen peroxide;
(c) removing the aqueous pretreatment composition from the substrate;
(d) contacting the substrate at least once with a non-aqueous composition as described herein, and
(e) removing the non-aqueous composition from the contact with the substrate.

The compositions comprising the non-polar organic protic solvent in combination and an H-silane is particularly useful for anti-pattern-collapse treatment of substrates comprising patterns having line-space dimensions of 50 nm or less, particularly of 32 nm or less and, most particularly 22 nm or less. Furthermore, the compositions according to the invention is particularly useful for aspect ratios greater or equal 4 without causing pattern collapse. Last not least, due to the use of a non-polar organic solvent and optionally an alkane as solvent, the composition has an excellent compatibility with substrates comprising polyvinyl chloride.

It has to be noted that the cleaning or rinsing solutions comprising the non-polar organic solvent in combination with an H-silane are generally useful for avoiding pattern collapse of photoresist structures as well as of non-photoresist patterns with high aspect ratios stacks (HARS), particularly patterned multi-stack material layers containing or consisting of silicon, silicon dioxide or silicon nitride layers, and stacks comprising alternating polysilicon and silicon dioxide or silicon nitride layers.

DETAILED DESCRIPTION OF THE INVENTION

The present invention is directed to a composition particularly suitable for manufacturing patterned materials comprising sub 50 nm sized features like integrated circuit (IC) devices, optical devices, micromachines and mechanical precision devices, in particular IC devices.

Any customary and known substrates used for manufacturing IC devices, optical devices, micromachines and mechanical precision devices can be used in the process of the invention. Preferably, the substrate is a semiconductor substrate, more preferably a silicon wafer, which wafers are customarily used for manufacturing IC devices, in particular IC devices comprising ICs having LSI, VLSI and ULSI.

The composition is particularly suitable for treating substrates having patterned material layers having line-space dimensions of 50 nm and less, in particular, 32 nm and less and, especially, 22 nm and less, i.e. patterned material layers for the sub-22 nm technology nodes. The patterned material layers preferably have aspect ratios above 4, preferably above 5, more preferably above 6, even more preferably above 8, even more preferably above 10, even more preferably above 12, even more preferably above 15, even more preferably above 20. The smaller the line-space dimensions and the higher the aspect ratios are the more advantageous is the use of the composition described herein.

The composition according to the present invention may be applied to substrates of any patterned material as long as structures tend to collapse due to their geometry.

By way of example, the patterned material layers may be
(a) patterned silicon oxide or silicon nitride coated Si layers,
(b) patterned barrier material layers containing or consisting of ruthenium, cobalt, titanium nitride, tantalum or tantalum nitride,
(c) patterned multi-stack material layers containing or consisting of layers of at least two different materials selected from the group consisting of silicon, polysilicon, silicon dioxide, SiGe, low-k and ultra-low-k materials, high-k materials, semiconductors other than silicon and polysilicon, and metals, and
d) patterned dielectric material layers containing or consisting of silicon dioxide or low-k or ultra-low-k dielectric materials.

Particularly preferred patterned material layers may be patterned silicon layers,
silicon oxide or silicon nitride coated Si layers, and
patterned multi-stack material layers containing or consisting of layers of at least two different materials selected from the group consisting of silicon, polysilicon, silicon dioxide, SiGe, low-k and ultra-low-k materials, high-k materials, semiconductors other than silicon and polysilicon, and metals, and
patterned dielectric material layers containing or consisting of silicon dioxide or low-k or ultra-low-k dielectric materials.

These materials may not be treated with an HF pretreatment solution but require an alkaline SC1 pretreatment and the effect of the composition and method according to the present invention is particularly pronounced for such materials and pretreatment.

Solvent

The non-aqueous anti-pattern-collapse composition comprises a non-polar organic solvent which may be either (i) a linear, branched or cyclic $C_5$ to $C_{12}$ alkane, or (ii) a benzene substituted by 1 to 3 $C_1$ to $C_4$ alkyl groups, or (iii) a combination thereof.

Even if non-polar organic solvents have a low hygroscopicity and contain a rather low amount of residual water, it may nevertheless be advantageous to remove the water residues by drying before its use in the anti-pattern-collapse compositions.

As used herein, "non-aqueous" means that the composition may only contain low amounts of water up to about 1% by weight. Preferably the non-aqueous composition comprises less than 0.5% by weight, more preferably less than 0.2% by weight, even more preferably less than 0.1% by weight, even more preferably less than 0.05% by weight, even more preferably less than 0.02% by weight, even more preferably less than 0.01% by weight, even more preferably less than 0.001% by weight of water. Most preferably essentially no water is present in the composition. "Essentially" here means that the water present in the composition does not have a significant influence on the performance of the additive in the non-aqueous solution with respect to pattern collapse of the substrates to be treated.

The organic solvents need to have a boiling point sufficiently low to be removed by heating without negatively impacting the substrate treated with the composition. For typical substrates, the boiling point of the organic solvent should be 150° C. or below, preferably 100° C. or below.

In a preferred embodiment the solvent essentially consists of one or more non-polar organic solvents, preferably a single non-polar organic solvent. I.e. no other solvent except the non-polar solvent(s) is present in the composition.

In another preferred embodiment the non-polar organic solvent may be linear, branched or cyclic hexane, heptane, octane, nonane, decane, or mixtures thereof; particularly linear, branched or cyclic hexane, heptane, or octane. The most preferred $C_5$ to $C_{12}$ alkanes are linear or branched heptane, particularly n-heptane, cyclohexane and cycloheptane, methylcyclohexane.

In yet another preferred embodiment the non-polar organic solvent is selected from toluene, 1,2-xylene, 1,3-xylene, 1,4-xylene, ethylbenzene, 1,2-diethylbenzene, 1,3-diethylbenzene, 1,4-diethylbenzene, particularly 1,2-xylene, 1,3-xylene, 1,4-xylene, or mixtures thereof.

Additives of Formula I or II

In a first embodiment the non-ionic H-silane additive according to the present invention (also referred to as additive or more specifically silane or siloxane) may be selected from formula I or II:

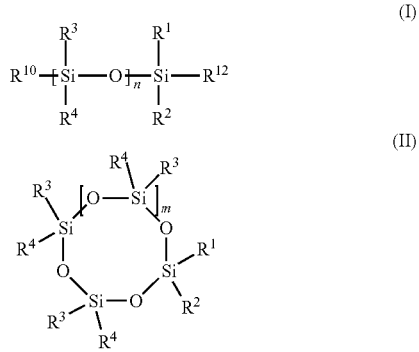

Herein $R^1$ is H, i.e. the additive according to the invention is an H-silane or H-siloxane. The H-silane or H-siloxane show a much better performance compared to other silanes or siloxanes like tetraethyl orthosilicate.

In formula I and II $R^2$ may be selected from H, $C_1$ to $C_{10}$ alkyl, $C_1$ to $C_{10}$ alkoxy, $C_6$ to $C_{12}$ aryl, and $C_6$ to $C_{10}$ aroxy. Preferably $R^2$ may be selected from $C_1$ to $C_8$ alkyl, $C_1$ to $C_8$ alkoxy. More preferably $R^2$ may be selected from $C_1$ to $C_6$ alkyl and $C_1$ to $C_6$ alkoxy. Most preferably $R^2$ may be selected from $C_1$ to $C_4$ alkyl and $C_1$ to $C_4$ alkoxy. Most preferred groups $R^2$ may be selected from methyl, ethyl, methoxy and ethoxy.

$R^3$ may be selected from H, $C_1$ to $C_{10}$ alkyl, $C_1$ to $C_{10}$ alkoxy, $C_6$ to $C_{10}$ aryl, and $C_6$ to $C_{10}$ aroxy. Preferably $R^3$ may be selected from H, $C_1$ to $C_8$ alkyl, $C_1$ to $C_8$ alkoxy. More preferably $R^3$ may be selected from H, $C_1$ to C alkyl and $C_1$ to C alkoxy. Even more preferably $R^3$ may be selected from H, $C_1$ to $C_4$ alkyl and $C_1$ to $C_4$ alkoxy. Most preferred groups $R^3$ may be selected from H, methyl, ethyl, methoxy and ethoxy.

$R^4$ may be selected from $C_1$ to $C_{10}$ alkyl, $C_1$ to $C_{10}$ alkoxy, $C_6$ to $C_{10}$ aryl, and $C_6$ to $C_{10}$ aroxy. Preferably $R^4$ may be selected from $C_1$ to $C_8$ alkyl, $C_1$ to $C_8$ alkoxy. More preferably $R^4$ may be selected from $C_1$ to $C_6$ alkyl and $C_1$ to $C_6$ alkoxy. Most preferably $R^4$ may be selected from $C_1$ to $C_4$ alkyl and $C_1$ to $C_4$ alkoxy. Most preferred groups $R^4$ may be selected from methyl, ethyl, methoxy and ethoxy.

$R^{10}$, $R^{12}$ may be independently selected from $C_1$ to $C_{10}$ alkyl and $C_1$ to $C_{10}$ alkoxy. Preferably $R^{10}$, $R^{12}$ and $R^4$ may be selected from $C_1$ to $C_8$ alkyl, $C_1$ to $C_8$ alkoxy. More preferably $R^{10}$ and $R^{12}$ may be selected from $C_1$ to $C_6$ alkyl and $C_1$ to $C_6$ alkoxy. Most preferably $R^{10}$ and $R^{12}$ may be selected from $C_1$ to $C_4$ alkyl and $C_1$ to $C_4$ alkoxy. Most preferred groups $R^4$ may be selected from methyl, ethyl, methoxy and ethoxy.

In formula I n may be 0 or an integer from 1 to 100, preferably 0, or an integer from 1 to 50, even more preferably 0 or an integer from 1 to 20, most preferably 0. In formula II m may be 1, 2 or 3, preferably 1.

Preferably $R^2$, $R^4$, $R^{10}$, and $R^{12}$ are independently selected from methyl, methoxy, ethyl, ethoxy, propyl, and propoxy.

In a particular preferred embodiment the additive is selected from trimethoxysilane, triethoxysilane, trimethylsilane, and triethylsilane.

The concentration should be sufficiently high to properly prevent pattern collapse but should be as low as possible for economic reasons. The concentration of the additives of formula I or II in the non-aqueous solution may generally be in the range of about 0.00005 to about 15% by weight. Preferably the concentration of the additive if from about 0.001 to about 12% by weight, more preferably from about 0.005 to about 12% by weight, even more preferably from about 0.05 to about 10% by weight, and most preferably 0.1 to 5% by weight, the weight percentages being based on the overall weight of the composition.

There may be one or more additives in the composition, however it is preferred to use only one additive of formula I or II.

Further Additives

Further additive may be present in the cleaning solution according to the present invention.

Such additives may be (I) buffer components for pH adjustment such as but not limited to $(NH_4)_2CO_3/NH_4OH$, $Na_2CO_3/NaHCO_3$, tris-hydroxymethyl-aminomethane/HCl, $Na_2HPO_4/NaH_2PO_4$, or organic acids like acetic acid etc., methanesulfonic acid;

(II) one or more further additives, either non-ionic, or, anionic to improve surface tension and solubility of the mixture;

(III) dispersants to prevent the surface re-attachment of the removed particles of dirt or polymer;

(IV) ammonia, as described in non-published European Patent application No. 19168153.5 to further activate the H-silane additive described above. Such activation is generally possible by adding from about 0.05 to about 8% by weight of ammonia to the solution. Below 0.05% by weight the activation is insufficient, using more than about 8% by weight is difficult to achieve due to limited solubility of ammonia in the protic organic solvent. Preferably 0.2 to 6% by weight, more preferably from 0.3 to 4% by weight, most preferably 0.5 to 2% by weight are used for the activation.

Rinsing Solution

Preferably the non-aqueous composition consists essentially of the organic non-polar solvent, the at least one additive of formula I or II, optionally ammonia, and reaction products thereof.

If ammonia is used, it is preferably added in situ just before its use. Therefore, it is advantageous to supply the compositions as a two-component kit comprising (a) ammonia dissolved in the organic protic solvent and optionally a $C_5$ to $C_{12}$ alkane, and (b) at least one additive of formulae I or II as described herein.

Application

The compositions described herein may be used for treating substrates having patterned material layers having line-space dimensions of 50 nm or below, aspect ratios of greater or equal 4, or a combination thereof.

The compositions described herein may be used in a method for manufacturing integrated circuit devices, optical devices, micromachines and mechanical precision devices, the said method comprising the steps of (a) providing a substrate having patterned material layers having line-space dimensions of 50 nm or below, aspect ratios of greater or equal 4, or a combination thereof, (b) contacting the substrate with an aqueous pretreatment composition comprising ammonia and hydrogen peroxide;

(c) removing the aqueous pretreatment composition from the substrate;

(d) contacting the substrate at least once with a non-aqueous composition according to anyone of claims 1 to 8, and (e) removing the non-aqueous composition from the contact with the substrate.

In a first step (a) a substrate having patterned material layers having line-space dimensions of 50 nm or below, aspect ratios of greater or equal 4, or a combination thereof is provided.

The substrate is preferably provided by a photolithographic process comprising the steps of (i) providing the substrate with an immersion photoresist, EUV photoresist or eBeam photoresist layer, (ii) exposing the photoresist layer to actinic radiation through a mask with or without an immersion liquid, (iii) developing the exposed photoresist layer with a developer solution to obtain a pattern having line-space dimensions of 32 nm and less and an aspect ratio of 4 or more, (iv) spin drying the semiconductor substrate after the application of the composition.

Any customary and known immersion photoresist, EUV photoresist or eBeam photoresist can be used. The immersion photoresist may already contain at least one of the siloxane additives or a combination thereof. Additionally, the immersion photoresist may contain other nonionic additives. Suitable nonionic additives are described, for example, in US 2008/0299487 A1, page 6, paragraph [0078]. Most preferably, the immersion photoresist is a positive resist.

Beside e-Beam exposure or extreme ultraviolet radiation of approx. 13.5 nm, preferably, UV radiation of the wavelength of 193 nm is used as the actinic radiation.

In case of immersion lithography preferably, ultra-pure water is used as the immersion liquid.

Any customary and known developer solution can be used for developing the exposed photoresist layer. Preferably, aqueous developer solutions containing tetramethylammonium hydroxide (TMAH) are used.

Customary and known equipment customarily used in the semiconductor industry can be used for carrying out the photolithographic process in accordance with the method of the invention.

In step (b) a so called SC1 pretreatment is performed. Preferably such aqueous SC1 pretreatment composition comprises from 0.1 to 5% by weight, preferably from 0.5 to 3% by weight ammonia (as $NH_4OH$), and 1 to 20% by weight, preferably from 5 to 17% by weight hydrogen peroxide. The pretreatment is usually performed for about 10 s to about 10 min, more preferably from about 20 s to about 5 min, most preferably from about 30 s to about 3 min.

As used herein, "aqueous" means that the solvent comprises water, preferably deionized water and, most preferably ultrapure water as the main solvent. The aqueous composition may contain water-miscible polar organic solvents, albeit only in such minor amounts that do not jeopardize the aqueous nature of the composition. It is preferred that the solvent essentially consists of water, preferably deionized water and, most preferably ultrapure water. Example of ultrapure water with concentration of 5 ppt (ng/kg), or better, anion concentration 5 ppb (ng/g), or better, total organic content (TOC) 50 ppb (ng/g), or better and contains particles of >0.2 mm under 10000 per ml.

In step (c) the pretreatment composition of step (b) is removed from the substrate. This is usually done by rinsing the substrate with ultrapure water. Preferably this step is preferably performed once, but may also be repeated, if required.

In step (d) the substrate is at least once brought into contact with the non-aqueous composition as described herein. This APCC treatment is usually performed for about 10 s to about 10 min, more preferably from about 20 s to about 5 min, most preferably from about 30 s to about 3 min.

Typically, all steps (a) to (d) may be used at any temperature from about 10 to about 40° C. If the temperature is higher, the compositions are not stable since the amount of ammonia will be quickly reduced by evaporation. A lower temperature is generally possible but would require intensive cooling. It is preferred that the temperature is from 10 to 35° C., even more preferred from 15 to 30° C.

In the fourth step (e) of the method the non-aqueous solution is removed from the contact with the substrate. Any known methods customarily used for removing liquids from solid surfaces can be employed. In a preferred embodiment this is done by (i) bringing the substrate into contact with a polar protic solvent, preferably a $C_1$ to $C_4$ alkanol, most preferably with 2-propanol, methanol or ethanol; and (ii) evaporating the polar protic solvent of step (i), preferably in the presence of an inert gas. Preferably the inert gas is nitrogen.

All percent, ppm or comparable values refer to the weight with respect to the total weight of the respective composition except where otherwise indicated. All cited documents are incorporated herein by reference.

EXAMPLES

Patterned silicon wafers with a circular nano pillar pattern were used to determine the pattern collapse performance of the formulations during drying. The (aspect ratio) AR 20 pillars used for testing have a height of 600 nm and a diameter of 30 nm. The pitch size is 90 nm. 1×1 cm wafer pieces where processed in the following sequence without drying in between:

Process sequence without drying in between:
40 sec SC1 dip ($NH_4OH$ (28%)/$H_2O_2$ (31%)/ultra pure water (UPW) in a weight ratio of 1/8/60)
60 s ultra-pure water (UPW) dip,
30 s isopropanol (IPA) dip,
60 s dip of a solution of the siloxane additive in the non-polar organic solvent at room temperature,
60 s IPA dip,
N2 blow dry.

The water content of the solvent was below 0.01% by weight.

The dried silicon wafers where analyzed with top down SEM and the collapse rates for examples 1.1 to 1.14 are shown in table 1.

acid. In this case the additive was not fully soluble in the nonpolar solvent. This makes them unusable.

It is important to note that, due to the different pretreatment and history of the respective wafers that were used, it is only possible to compare the results under comparable conditions, particularly the same stiffness.

The invention claimed is:

1. A non-aqueous composition consisting essentially of
   (a) an organic solvent selected from the group consisting of
       (i) a linear, branched or cyclic $C_5$ to $C_{12}$ alkane, and
       (ii) a benzene substituted by 1 to 3 $C_1$ to $C_4$ alkyl groups; and
   (b) at least one additive of formulae I or II

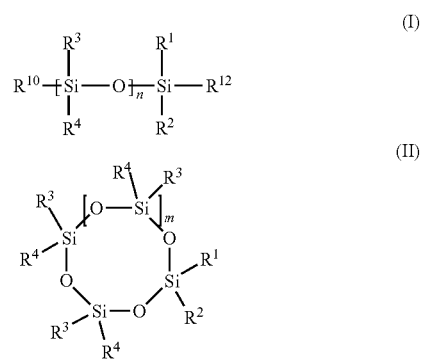

TABLE 1

| Example | Additive | Conc. [wt %] | Solvent | Conc. [wt %] | Stiffness [mN/m] | Uncollapsed rate [%] |
|---|---|---|---|---|---|---|
| C 1.1 | n/a | 0 | isopropanol | 100 | 44 | 0.4 |
| C 1.2 | triethoxysilane | 5 | isopropanol | 95 | 43 | 0.8 |
| C 1.3 | n/a | 0 | n-heptane | 100 | 43 | 1 |
| 1.4 | triethoxysilane | 0.2 | n-heptane | 99.8 | 43 | 5.9 |
| 1.5 | triethoxysilane | 2.5 | n-heptane | 97.5 | 42.5 | 9.2 |
| 1.6 | triethoxysilane | 5 | n-heptane | 95 | 43 | 61.3 |
| 1.7 | triethoxysilane | 10 | n-heptane | 90 | 42.5 | 48.7 |
| 1.8 | triethoxysilane | 20 | n-heptane | 80 | 42.5 | 36.8 |
| C 1.9 | n/a | 0 | n-decane | 100 | 43 | 1.6 |
| 1.10 | triethoxysilane | 2.5 | n-decane | 97.5 | 42 | 40.5 |
| 1.11 | triethoxysilane | 5 | n-decane | 95 | 42.5 | 63.3 |
| 1.12 | triethoxysilane | 10 | n-decane | 90 | 42 | 45.3 |
| C 1.13 | n/a | 0 | p-xylene | 100 | 43 | 1.7 |
| 1.14 | triethoxysilane | 5 | p-xylene | 95 | 42 | 43.1 |
| C1.15 | n/a | 0 | n-heptane | 100 | 77 | 4.3 |
| 1.16 | triethoxysilane | 5 | n-heptane | 95 | 77 | 77.7 |
| C1.17 | triethoxysilane | 4 | PGMEA*** | 96 | 43 | 0.6 |
| C1.18 | triethoxylsilane | 5 | n-heptane* | 94 | 45 | n/a** |

*1 wt % of trifluoromethanesulfonic acid was added to the composition
**The composition became turbid.
***PGMEA = propylene glycol methyl ether acetate Table 1 shows that the additives in combination with the non-polar solvents have an extraordinary effect on the degree of pattern collapse compared to the solution without any additive or with a polar protic solvent in case of an alkaline SC1 pretreatment. 01.17 shows that the non-polar solvents according to the invention lead to much higher non-collapse rates in contrast to other non-protic but more polar solvents according to the prior art. 01.18 shows that the nonpolar solvents cannot be used in combination with an wherein $R^1$ is H $R^2$ is selected from the group consisting of H, $C_1$ to $C_{10}$ alkyl, $C_1$ to $C_{10}$ alkoxy, $C_6$ to $C_{10}$ aryl, and $C_6$ to $C_{10}$ aroxy, $R^3$ is selected from the group consisting of $R^2$, $R^4$ is selected from the group consisting of $C_1$ to $C_{10}$ alkyl, $C_1$ to $C_{10}$ alkoxy, $C_6$ to $C_{10}$ aryl, and $C_6$ to $C_{10}$ aroxy, $R^{10}$, $R^{12}$ are independently selected from the group consisting of $C_1$ to $C_{10}$ alkyl and $C_1$ to $C_{10}$ alkoxy, m is 1, 2 or 3, and n is 0 or an integer from 1 to 100.

2. The composition according to claim 1, wherein the organic solvent is selected from the group consisting of hexane, heptane, octane, nonane, and decane.

3. The composition according to claim 1, wherein the organic solvent is selected from the group consisting of toluene, 1,2-xylene, 1,3-xylene, 1,4-xylene, ethylbenzene, 1,2-diethylbenzene, 1,3-diethylbenzene, and 1,4-diethylbenzene.

4. The composition according to claim 1, wherein a content of water in the non-aqueous composition is lower than 0.1% by weight.

5. The composition according to claim 1, wherein the at least one additive of formulae I or II is present in a concentration from 2.5 to 15% by weight.

6. The composition according to claim 1, wherein the at least one additive is a compound of formula I, wherein n is 0, 1 or 2.

7. The composition according to claim 1, wherein $R^2$, $R^4$, $R^{10}$, and $R^{12}$ are independently selected from the group consisting of methyl, methoxy, ethyl, ethoxy, propyl, and propoxy.

8. The composition according to claim 1, wherein the at least one additive is selected from the group consisting of trimethoxysilane, triethoxysilane, trimethylsilane, and triethylsilane.

9. A method of using the composition according to claim 1, the method comprising using the composition for treating substrates having patterned material layers having line-space dimensions of 50 nm or below, aspect ratios of greater than or equal to 4, or a combination thereof.

10. A method for manufacturing integrated circuit devices, optical devices, micromachines and mechanical precision devices, the method comprising (a) providing a substrate having patterned material layers having line-space dimensions of less than or equal to 50 nm, aspect ratios of greater than or equal to 4, or a combination thereof;

(b) contacting the substrate with an aqueous pretreatment composition comprising ammonia and hydrogen peroxide;

(c) removing the aqueous pretreatment composition from the substrate;

(d) contacting the substrate at least once with the non-aqueous composition according to claim 1; and (e) removing the non-aqueous composition from the contact with the substrate.

11. The method according to claim 10, wherein the patterned material layers have line-space dimensions of less than or equal to 32 nm and aspect ratios of greater than or equal to 10.

12. The method according to claim 10, wherein the patterned material layers comprise silicon, silicon oxide or silicon nitride.

13. The method according to claim 10, wherein in step (b), from 0.1 to 5% by weight ammonia (as $NH_4OH$), and from 1 to 20% by weight hydrogen peroxide are used.

14. The method according to claim 10, wherein the patterned material layers are selected from the group consisting of patterned multi-stack material layers and patterned dielectric material layers.

15. The composition according to claim 1, wherein the at least one additive of formulae I or II is present in a concentration from 3.5 to 12% by weight.

16. The composition according to claim 1, wherein the at least one additive is a compound of formula I, wherein n is 0 or 1.

17. The method according to claim 10, wherein in step (b), from 0.5 to 3% by weight ammonia (as $NH_4OH$), and from 1 to 20% by weight hydrogen peroxide are used.

18. The method according to claim 10, wherein in step (b), from 0.1 to 5% by weight ammonia (as $NH_4OH$), and from 5 to 17% by weight hydrogen peroxide are used.

* * * * *